United States Patent
Jung et al.

(10) Patent No.: US 7,968,410 B2
(45) Date of Patent: Jun. 28, 2011

(54) METHOD OF FABRICATING A SEMICONDUCTOR DEVICE USING A FULL SILICIDATION PROCESS

(75) Inventors: Eun-ji Jung, Suwon-si (KR); Sang-woo Lee, Seoul (KR); Jeong-gil Lee, Goyang-si (KR); Gil-heyun Choi, Seoul (KR); Chang-won Lee, Gwacheon-si (KR); Byung-hee Kim, Seoul (KR); Jin-ho Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 70 days.

(21) Appl. No.: 12/460,945

(22) Filed: Jul. 27, 2009

(65) Prior Publication Data

US 2010/0112772 A1    May 6, 2010

(30) Foreign Application Priority Data

Nov. 6, 2008 (KR) .................. 10-2008-0110030

(51) Int. Cl.
*H01L 21/336* (2006.01)
(52) U.S. Cl. .................. 438/287; 257/E21.423
(58) Field of Classification Search .................. 438/287; 257/E21.423
See application file for complete search history.

(56) References Cited

U.S. PATENT DOCUMENTS

| | | | |
|---|---|---|---|
| 7,217,610 B2 * | 5/2007 | Graf et al. ...................... 438/210 |
| 2006/0208338 A1 * | 9/2006 | Lee et al. ...................... 257/516 |
| 2006/0263961 A1 | 11/2006 | Kittl et al. |
| 2007/0026621 A1 * | 2/2007 | Cho et al. ...................... 438/314 |
| 2007/0173025 A1 | 7/2007 | Akamatsu |
| 2007/0228458 A1 | 10/2007 | Henson et al. |

FOREIGN PATENT DOCUMENTS

JP    2007-201063    8/2009

* cited by examiner

*Primary Examiner* — David Vu
*Assistant Examiner* — Shaun Campbell
(74) *Attorney, Agent, or Firm* — Mills & Onello, LLP

(57) ABSTRACT

A method of fabricating a semiconductor device includes: forming a first polysilicon layer having a first thickness in a peripheral circuit region formed on a substrate; forming a stack structure comprising a first tunneling insulating layer, a charge trap layer, and a blocking insulating layer in a memory cell region formed on the substrate; forming a second polysilicon layer having a second thickness that is less than the first thickness on the blocking insulating layer; and forming gate electrodes by siliciding the first and second polysilicon layers.

11 Claims, 8 Drawing Sheets

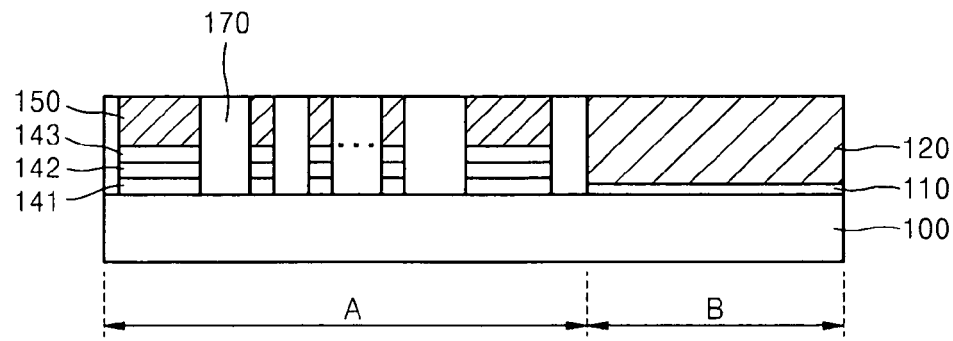
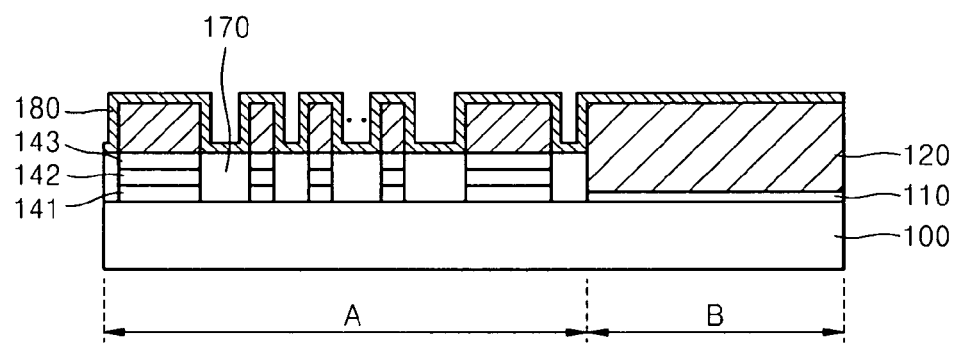
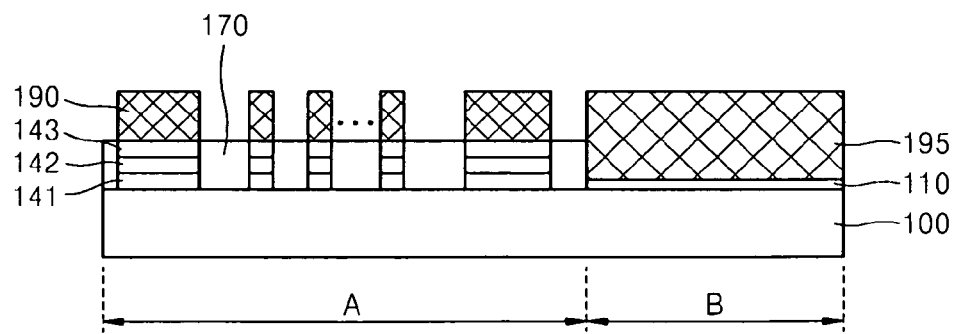

METHOD OF FABRICATING A SEMICONDUCTOR DEVICE USING A FULL SILICIDATION PROCESS

CROSS-REFERENCE TO RELATED APPLICATIONS

This application claims the benefit under 35 U.S.C. 119 of Korean Patent Application No. 10-2008-0110030, filed on Nov. 6, 2008, in the Korean Intellectual Property Office, the entire contents of which are incorporated herein by reference.

BACKGROUND

The inventive concept relates to a method of fabricating a semiconductor device, and more particularly, to a method of fabricating a semiconductor device using a silicidation process.

As the degree of semiconductor device integration increases, a design rule becomes more strict, and the critical dimension (CD) is reduced. As a result, in semiconductor devices, because of reduced wiring and contact size, increases in wiring resistance and contact resistance become more significant. An increase in wiring resistance and contact resistance can lower semiconductor device performance. In order to reduce wiring resistance and contact resistance, a method of forming a silicide layer on gate electrodes and source/drain regions of semiconductor devices using self-alignment may be used.

In particular, in a full silicide (FUSI) layer, a gate poly oxide (GPox) process is not greatly restricted due to oxidation compared to other metal layers. Device reliability can be prevented from being lowered due to an etch byproduct formed of a high-k dielectric material.

SUMMARY

According to an aspect of the inventive concept, there is provided a method of fabricating a semiconductor device, the method including: forming a first polysilicon layer having a first thickness in a peripheral circuit region disposed on a substrate; forming a stack structure including a first tunneling insulating layer, a charge trap layer, and a blocking insulating layer in a memory cell region disposed on the substrate; forming a second polysilicon layer having a second thickness that is less than the first thickness on the blocking insulating layer; and forming gate electrodes by siliciding the first and second polysilicon layers.

The method may further include forming a second tunneling insulating layer in the peripheral circuit region of the substrate, wherein the forming of the first polysilicon layer includes forming the first polysilicon layer on the second tunneling insulating layer. The second tunneling insulating layer may include $SiO_2$. The method may further include forming a p-channel metal oxide semiconductor (PMOS) transistor or an n-channel metal oxide semiconductor (NMOS) transistor in the peripheral circuit region according to the type of dopant doped into the second tunneling insulating layer.

The blocking insulating layer may include a high-k dielectric material. The blocking insulating layer may include $HfSi_xO_y$.

The forming of the gate electrodes may include: forming a metal layer on the first and second polysilicon layers; and forming full silicide gate electrodes by a silicide reaction between the first and second polysilicon layers and the metal layer by heat-treating the metal layer.

The full silicide gate electrodes formed by the silicide reaction between the first polysilicon layer and the metal layer may include monosilicide gate electrodes having the same contents of silicon and metal. The full silicide gate electrodes formed by the silicide reaction between the second polysilicon layer and the metal layer may include metal-rich silicide gate electrodes having a higher content of metal than of silicon.

The method may further include forming a plurality of gate stack structures by patterning the second polysilicon layer, the blocking insulating layer, the charge trap layer, and the first tunneling insulating layer, which are formed in the memory cell region and forming a source/drain region by implanting an impurity into a surface of the substrate exposed to both sides of the plurality of gate stack structures.

The method may further include forming an oxide layer between each of the plurality of gate stack structures by performing an oxidation reaction over the substrate in which the plurality of gate stack structures are formed.

The forming of the metal layer may include forming the metal layer by simultaneously applying a metal material on the first and second polysilicon layers and the oxide layer.

The forming of the full silicide gate electrodes may include: performing a first heat treatment on the substrate in which the metal layer is formed, at a first temperature so as to cause the silicide reaction between the metal layer and the first polysilicon layer and between the metal layer and the second polysilicon layer; removing a portion of the metal layer formed on the oxide layer, since the silicide reaction does not occur between the oxide layer and the portion of the metal layer formed on the oxide layer during the first heat treatment; and performing a second heat treatment on the substrate in which the portion of the metal formed on the oxide layer is removed, at a second temperature higher than the first temperature so that a first full silicide gate electrode is formed by the silicide reaction between the first polysilicon layer and the metal layer and a second full silicide gate electrode is formed by the silicide reaction between the second polysilicon layer and the metal layer, the first polysilicon layer being a monosilicide gate electrode and the second polysilicon layer being a metal-rich silicide gate electrode.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

FIGS. 2 through 10 are cross-sectional views illustrating a method of fabricating a semiconductor device, according to an embodiment of the inventive concept.

DETAILED DESCRIPTION OF THE EMBODIMENTS

Figure 1:
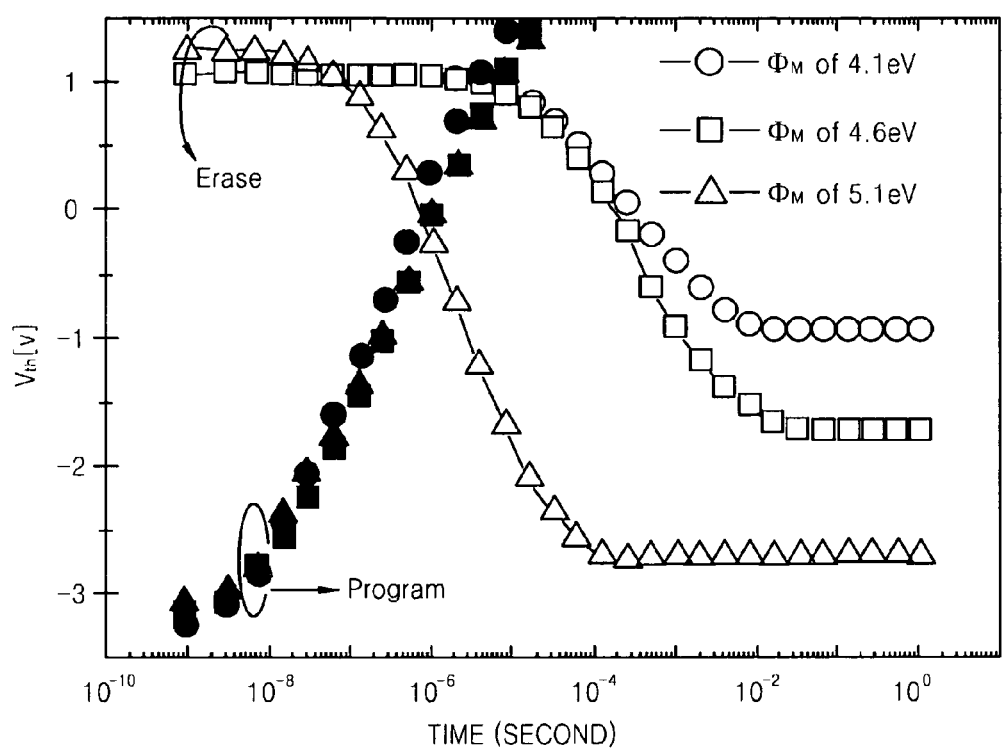
FIG. 1 is a graph showing programming/erase operations performed on a charge trap flash (CTF) memory according to a work function of a material used in forming a control gate.

Hereinafter, the inventive concept will be described in detail by describing exemplary embodiments of the invention with reference to the attached drawings. The inventive concept may, however, be embodied in many different forms and should not be construed as being limited to the embodiments set forth herein; rather, these embodiments are provided so that this description will be thorough and complete, and will fully convey the invention to those skilled in the art. In the drawings, the thicknesses of layers and regions are exaggerated for clarity.

It will also be understood that when one element such as a layer, a region, a substrate, etc. is referred to as being "on", "connected to" or "coupled to" another element, it can be directly "on", "connected to" or "coupled to" the other element, or intervening elements may also be present. On the other hand, it will also be understood that when one element is referred to as being "directly on", "directly connected to" or "directly coupled to" another element, intervening elements may not be present. Like reference numerals in the drawings denote like elements. As used herein, the term "and/or," includes any and all combinations of one or more of the associated listed items.

It will be understood that, even though the terms first, second, etc. may be used herein to describe various elements, components, regions, layers and/or portions, these elements, components, regions, layers and/or portions should not be limited by these terms. These terms are only used to distinguish one element, component, region, layer or portion from another. For example, a first element, component, region, layer or portion could be termed a second element, component, region, layer or portion and, similarly, a second element, component, region, layer or portion could be termed a first element, component, region, layer or portion without departing from the scope of example embodiments.

It will be understood that the relative terms such as "on" or "above" and "under" or "below" may be used herein to describe the relationship between one element and another element as illustrated in the drawings. It will also be understood that the relative terms are intended to include the other directions of one element in addition to a direction depicted in the drawings. For example, if an element is turned over in the drawings, elements that are depicted as being present on a side formed on another elements have a direction on a side formed under the other elements. Therefore, the term "on" may include all of directions "under" and "on" depending on a specific direction of the drawings. When the element is directed in other directions (is rotated by 90 degrees in other directions), the relative descriptions used herein may be interpreted accordingly.

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1 is a graph showing programming/erase operations performed on a charge trap flash (CTF) memory according to a work function of a material used in forming a control gate.

Referring to FIG. 1, ○ indicates an erase operation performed on the CTF memory when a metal having a work function of 4.1 eV is used in forming a control gate. □ indicates an erase operation performed on the CTF memory when a metal having a work function of 4.6 eV is used in forming a control gate. Δ indicates an erase operation performed on the CTF memory when a metal having a work function of 5.1 eV is used in forming a control gate. ● indicates a programming operation performed on the CTF memory when a metal having a work function of 4.1 eV is used in forming a control gate. ■ indicates a programming operation performed on the CTF memory when a metal having a work function of 4.6 eV is used in forming a control gate. ▲ indicates a programming operation performed on the CTF memory when a metal having a work function of 5.1 eV is used in forming a control gate.

Generally, a CTF memory has a structure in which a substrate, a tunnelling insulating layer, a charge trap layer, a blocking insulating layer, and a control gate are stacked sequentially. In this structure arrangement, the control gate is connected to a word line. Thus, a programming/erase operation is performed on the CTF memory according to a voltage applied to the control gate.

Referring to FIG. 1, when a programming operation is performed on the CTF memory, the programming operation is performed irrespective of the work function of the control gate. Specifically, the threshold voltage Vth of the CTF memory is raised to a predetermined level after a predetermined amount of time elapses regardless of a work function of the control gate such that the programming operation is performed. However, when an erase operation is performed on the CTF memory, the erase operation is affected by the work function of the control gate. For example, when a metal having the highest work function of 5.1 eV is used to form the control gate, the threshold voltage Vth of the CTF memory is reduced to a predetermined level within a shorter time compared to metals having lower work functions such that the erase operation is performed more quickly.

In this way, the programming operation of the CTF memory is not affected by the work function of the control gate. On the other hand, the erase operation of the CTF memory is enhanced when a metal having a high work function is used to form the control gate. This is because, as a barrier height between the blocking insulating layer and the control gate increases, the amount of electron back tunnelling through the control gate during the erase operation can be reduced. Thus, a material having a high work function may be used to form the control gate, and a method of increasing the work function of the control gate when a silicide layer is used to form the control gate is needed.

In a full silicide (FUSI) layer, gate poly oxide (GPox) process restrictions due to oxidation are not large compared to other metal layers. Additionally, lowering of device reliability due to an etch byproduct formed of a high-k dielectric material can be prevented. However, when a FUSI process in a process of fabricating the CTF memory is performed, polycide, in which a polysilicon layer is formed below a silicide layer, is formed in a peripheral circuit region. Polycide may be agglomerated in a subsequent heat treatment process and thus has a low thermal stability.

FIGS. 2 through 10 are cross-sectional views illustrating a method of fabricating a semiconductor device, according to an embodiment of the inventive concept.

In the current embodiment, the semiconductor device may be a NAND flash memory. Hereinafter, a method of fabricating a NAND flash memory will be described with reference to FIGS. 2 through 10. However, the current embodiment is just an exemplary embodiment of the inventive concept, and the inventive concept may be used to fabricate other semiconductor devices. For example, the inventive concept may be used to fabricate a semiconductor device including a floating gate.

Figure 2:
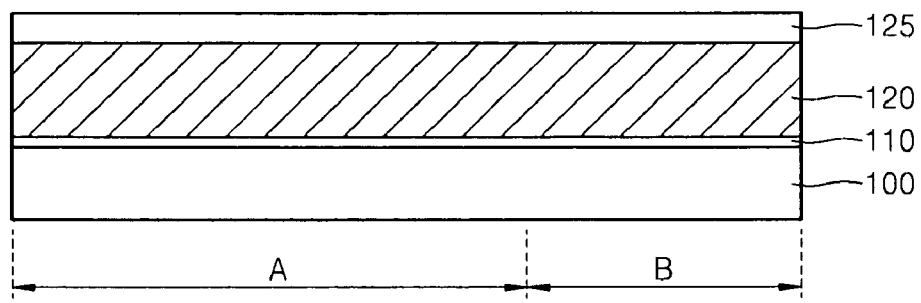

Referring to FIG. 2, a substrate 100 is prepared and includes a memory cell region A and a peripheral circuit region B. Subsequently, a first tunneling insulating layer 110, a first polysilicon layer 120, and a first insulating layer 125 are sequentially formed on the substrate 100.

The substrate 100 may be a semiconductor substrate, which is formed of a material such as silicon, silicon-on-insulator, silicon-on-sapphire, silicon-germanium, gallium-arsenide, and germanium. In addition, the substrate 100 may be a P-type substrate in which a P-type impurity such as boron (B) is injected into a portion of the substrate 100 or an N-type substrate in which an N-type impurity such as arsenide (As) is injected into a portion of the substrate 100.

The memory cell region A is a region in which a plurality of memory cell transistors, a string select line (SSL), and a ground select line (GSL) are formed. The peripheral circuit region B is a region in which a peripheral circuit including a plurality of n-channel metal oxide semiconductor (NMOS) transistors and a plurality of p-channel metal oxide semiconductor (PMOS) transistors are formed. Here, an active region of each of the memory cell region A and the peripheral circuit region B is defined by a device isolation layer (not shown).

The first tunneling insulating region 110 may include a silicon dioxide ($SiO_2$) layer. In the current embodiment, the silicon oxide layer ($SiO_2$) may be used as the first tunneling insulating layer 110, and the type of dopant doped into the first tunneling insulating layer 110 determines whether a PMOS transistor or an NMOS transistor in the peripheral circuit region B is formed, since a work function of the control gate varies according to the type of the dopant doped into the first tunneling insulating layer 110. Further detailed description of this concept is made below with reference to FIGS. 11A and 11B.

The first polysilicon layer 120 is used to form NMOS transistors and PMOS transistors in the peripheral circuit region B. Here, the first polysilicon layer 120 may be an N-type-doped crystalline or amorphous silicon. In the current embodiment, the first polysilicon layer 120 may be formed to have a first thickness, for example, of about 700 Å. The first insulating layer 125 may be an oxide layer such as a medium temperature oxide (MTO) layer.

Figure 3:
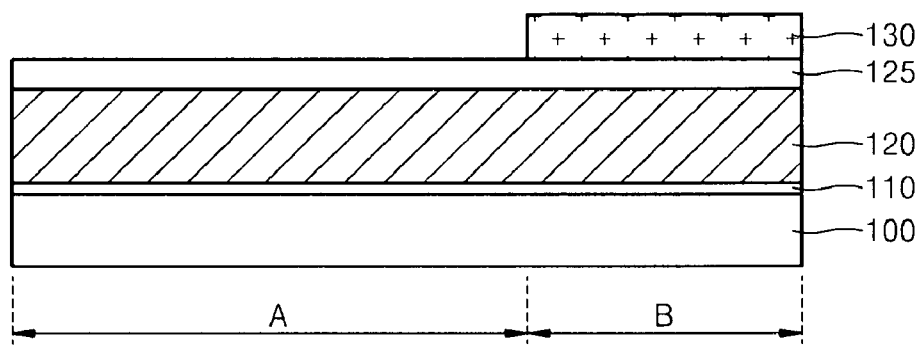

Referring to FIG. 3, a photoresist 130 is applied to the first insulating layer 125 formed in the peripheral circuit region B, thereby forming a photoresist pattern that exposes only the memory cell region A.

Figure 4:
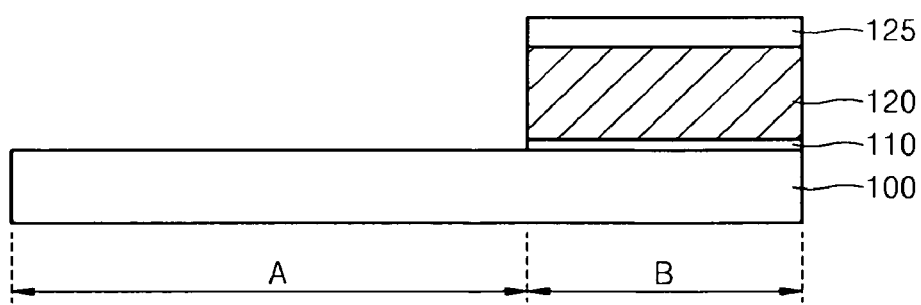

Referring to FIG. 4, the first tunneling insulating layer 110, the first polysilicon layer 120, and the first insulating layer 125 are removed from the memory cell region A.

Figure 5:
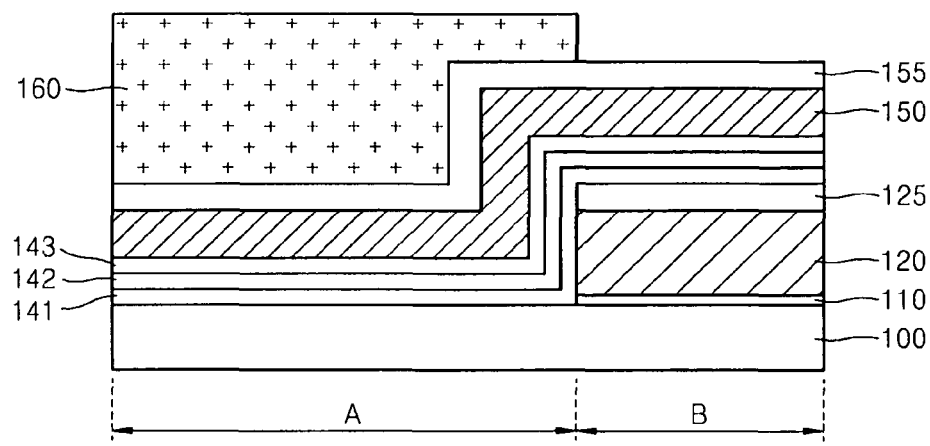

Referring to FIG. 5, a second tunneling insulating layer 141, a charge trap layer 142, a blocking insulating layer 143, a second polysilicon layer 150, and a second insulating layer 155 are sequentially formed on the first insulating layer 125 formed in the peripheral circuit region B and in an upper portion of the memory cell region A. Subsequently, a photoresist 160 is applied to the second insulating layer 155 formed in the memory cell region A, thereby forming a photoresist pattern that exposes only the peripheral circuit region B.

More specifically, the second tunneling insulating layer 141 is formed on the substrate 100 of the memory cell region A and the first insulating layer 125 of the peripheral circuit region B. The second tunneling insulating layer 141 may be an oxide layer having a thickness of about 20 Å to about 70 Å, for example.

Next, the charge trap layer 142 is formed on the second tunneling insulating layer 141. Here, the charge trap layer 142 may be used as a floating gate and may be a silicon nitride (SiN) layer or a high-k dielectric layer having a higher dielectric constant than the silicon nitride (SiN) layer. For example, the charge trap layer 142 may be a $Si_3N_4$ layer, a metal oxide layer, a metal nitride layer or a combination thereof. The charge trap layer 142 may be formed to a thickness of about 40 Å to about 120 Å. Here, the charge trap layer 142 includes a trap site that stores charges passing through the second tunneling insulating layer 141.

Next, the blocking insulating layer 143 is formed on the charge trap layer 142. Here, the blocking insulating layer 143 may be formed of a high-k dielectric material such as $Al_2O_3$, $ZrO_2$ or $HfO_2$. Due to the blocking insulating layer 143, when electrons are trapped in the trap site of the charge trap layer 142, the electrons may be prevented from being discharged into the control gate (in the current embodiment, a silicide layer to be formed on the blocking insulating layer 143), and the electrons discharged into the control gate may be prevented from being injected into the charge trap layer 142.

Next, the second polysilicon layer 150 to be used in a silicidation process is formed on the blocking insulating layer 143. Here, the second polysilicon layer 150 may be an N-type doped crystalline or amorphous silicon. In the current embodiment, the second polysilicon layer 150 may be formed to have a second thickness. Here, the second thickness may be smaller than the first thickness, which is the thickness of the first polysilicon layer 120. For example, the second thickness may be about 300 Å.

Next, the second insulating layer 155 is formed on the second polysilicon layer 150. Here, the second insulating layer 155 may be an oxide layer.

Figure 6:
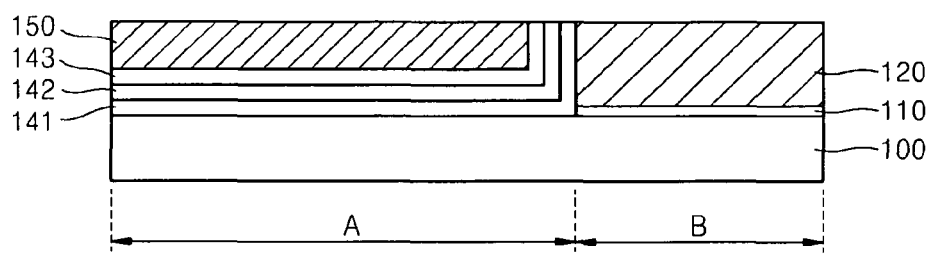

Referring to FIG. 6, the second insulating layer 155 formed in the memory cell region A, the second insulating layer 155 formed in the peripheral circuit region B, the second polysilicon layer 150 formed in the peripheral circuit region B, the blocking insulating layer 143 formed in the peripheral circuit region B, the charge trap layer 142 formed in the peripheral circuit region B, the first tunneling insulating layer 141 formed in the peripheral circuit region B, and the first insulating layer 125 formed in the peripheral circuit region B are removed, and the photoresist 160 is removed.

Figure 7:
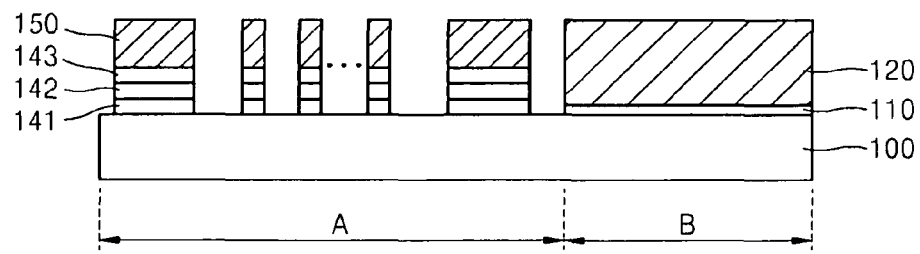

Referring to FIG. 7, a plurality of gate stack structures are formed in the memory cell region A by patterning the second polysilicon layer 150 formed in the memory cell region A, the blocking insulating layer 143, the charge trap layer 142, and the second tunneling insulating layer 141. Specifically, the patterning process is performed by forming a photoresist pattern that exposes only a predetermined portion of the memory cell region A. In addition, an impurity is implanted into a surface of the substrate 100 exposed to both sides of the gate stack structures formed in the memory cell region A, and heat treatment is performed, thereby forming a source/drain region (not shown) on the substrate 100. As such, the string select line (SSL) and the ground select line (GSL) are formed at a boundary of the memory cell region A, and thus the memory cell transistors are formed in the middle of the memory cell region A.

In addition, although not shown in FIG. 7, a plurality of gate stack structures may be formed in the peripheral circuit region B by patterning the first polysilicon layer 120 and the first tunneling insulating layer 110 formed in the peripheral circuit region B, and an impurity is implanted into the surface of the substrate 100 exposed to both sides of the gate stack structures formed in the peripheral circuit region B, and heat treatment is performed so that the source/drain region can be formed on the substrate 100. In addition, as described above, different types of dopants doped into the first tunneling insulating layer 110 may form the pluralities of PMOS transistors and NMOS transistors in the peripheral circuit region B.

In addition, after the gate stack structures are formed in the memory cell region A and the peripheral circuit region B, a cleaning process may be performed.

Referring to FIG. 8, an oxidation process for forming an oxide layer 170 on the memory cell transistors formed in the memory cell region A, and on the PMOS transistors and NMOS transistors formed in the peripheral circuit region B is performed. In the current embodiment, the oxide layer 170 may be selectively formed on the memory cell transistors formed in the memory cell region A and the PMOS transistors and the NMOS transistors formed in the peripheral circuit region B.

In this way, in order to form insulation between the memory cells and insulation between the PMOS transistors and the NMOS transistors and to protect the active region of each of the memory cell region A and the peripheral circuit region B, an oxide is filled into regions between the memory cells and regions between the PMOS transistors and the NMOS transistors. In this way, the oxidation process is performed before a silicidation process is performed, so that the oxidation process can be more freely performed compared to a conventional process and reliability can be enhanced.

Referring to FIG. 9, the oxide layer 170 formed between the memory cells is removed to a predetermined depth by performing chemical mechanical polishing or etch back. In the current embodiment, the oxide layer 170 may be removed to a height at which the blocking insulating layer 143 is formed. However, the present invention is not limited thereto.

Subsequently, a metal layer 180 is formed on the second polysilicon layer 150 and the oxide layer 170 formed in the memory cell region A and on the first polysilicon layer 120 formed in the peripheral circuit region B. Specifically, the metal layer 180 is formed by simultaneously applying a metal material on the second polysilicon layer 150 and the oxide layer 170 formed in the memory cell region A and on the first polysilicon layer 120 formed in the peripheral circuit region B. Here, the metal layer 180 may be formed of a low-resistance metal for silicidation, such as nickel (Ni), titanium (Ti), tungsten (W), cobalt (Co) or an alloy containing platinum (Pt), rhenium (Re), boron (B), aluminum (Al), or germanium (Ge). Furthermore, an alloy material is added to the metal layer 180 so that a work function of the metal used in forming the metal layer 180 can be controlled. The metal layer 180 may be formed by using a physical vapor deposition (PVD) process, a chemical vapor deposition (CVD) process or an atomic layer deposition (ALD) process.

In the current embodiment, the metal layer 180 may be formed to a thickness of about 350 Å. As described above, the thickness of the first polysilicon layer 120 is made larger than the thickness of the second polysilicon layer 150. As such, a silicide layer that is formed by a silicide reaction that occurs between the second polysilicon layer 120 and the metal layer 180 has higher metal content compared to a silicide layer that is formed by a silicide reaction that occurs between the first polysilicon layer 120 and the metal layer 180, and a work function of the control gate can be increased compared to the conventional art.

In addition, although not shown in FIG. 9, in the current embodiment, a capping layer may be deposited on the metal layer 180. For example, the capping layer may be TiN or a composite layer of Ti/TiN.

Referring to FIG. 10, a resultant structure including the metal layer 180 is heat treated, and the heat treatment causes a silicide reaction between the metal layer 180 and the second polysilicon layer 150 formed in the upper portion of the memory cell region A, and between the metal layer 180 and the first polysilicon layer 120 formed in an upper portion of the peripheral circuit region B. As such, control gates of transistors formed in the memory cell region A and the peripheral circuit region B constitute a metal silicide layer. In this case, the metal silicide layer is a FUSI layer.

More specifically, the resultant structure in which the metal layer 180 is formed is heat treated, and a silicide reaction occurs between the second polysilicon layer 150 and the metal layer 180, and a silicide reaction occurs between the first polysilicon layer 120 and the metal layer 180, thereby performing a first silicidation process. In this case, a heat treatment process is performed on the substrate 100 in which the metal layer 180 is formed at a temperature of about 250° C. to about 550° C. by using a rapid thermal process (RTP) device or a furnace such that each of the second polysilicon layer 150 and the first polysilicon layer 120 reacts with the metal layer 180 and a metal silicide layer can be formed.

By performing the first silicidation process, the silicide reaction occurs between the first polysilicon layer 120 and the metal layer 180, and between the second polysilicon layer 150 and the metal layer 180, but the silicide reaction does not occur between the oxide layer 170 and a portion of the metal layer 180 formed on the oxide layer 170. Thus, the portion of the metal layer 180 formed on the oxide layer 170 is removed.

Subsequently, the resultant structure in which the metal layer 180 is formed is heat treated, and a silicide reaction occurs between the second polysilicon layer 150 and the metal layer 180 formed on the memory cell transistors in the memory cell region A, and a silicide reaction occurs between the first polysilicon layer 120 and the metal layer 180 in the peripheral circuit region B, thereby performing a second silicidation process. In this case, heat treatment is performed on the metal layer 180 at a temperature of about 400° C. to about 850° C. by using a RTP device or a furnace such that each of the second polysilicon layer 150 and the first polysilicon layer 120 reacts with the metal layer 1 80 and a first silicide layer 190 and a second silicide layer 195 can be formed.

In the current embodiment, the thickness of the first polysilicon layer 120 is different from the thickness of the second polysilicon layer 150. Thus, the first silicide layer 190 and the second silicide layer 195, which are formed as a result of a silicide reaction involving the metal layer 180 having the same thickness on each of the first polysilicon layer 120 and the second polysilicon layer 150, have different phases, and their metal to silicon ratios are different.

More specifically, the thickness of the first polysilicon layer 120 is greater than the thickness of the second polysilicon layer 150. Thus, the first silicide layer 190 is a metal-rich silicide layer having a higher content of metal than of silicon. For example, when the metal layer 180 includes nickel (Ni), the first silicide layer 190 may be a nickel-rich silicide layer ($Ni_{31}Si_{12}$). In addition, the second silicide layer 195 is a mono silicide layer having the same or nearly similar contents of silicon as of metal. For example, when the metal layer 180 includes Ni, the second silicide layer 195 may be a nickel-mono silicide layer (NiSi). Hereinafter, this will be described in more detail with reference to FIGS. 12A and 12B.

In this way, the control gates of the memory cell transistors formed in the memory cell region A are formed of a metal-rich silicide layer so that a work function of the metal used in forming the control gates can be increased compared to that of the conventional art. As such, the erase operation of the CTF memory can be enhanced. Specifically, when the metal silicide layer is formed, a work function of the metal used in forming the control gates can be increased by doping a dopant, forming an alloy or changing phases.

In this way, in the current embodiment, gate electrodes are formed of the first and second silicide layers 190 and 195 so that the resistance of the gate electrodes is reduced and the operating speed of the memory cell transistors can be increased. In addition, the gate electrodes are formed of a FUSI layer so that the characteristic of the memory cell transistors can be enhanced since a depletion layer is not formed, and the capacity of the blocking insulating layer 143 is prevented.

Figure 11A:
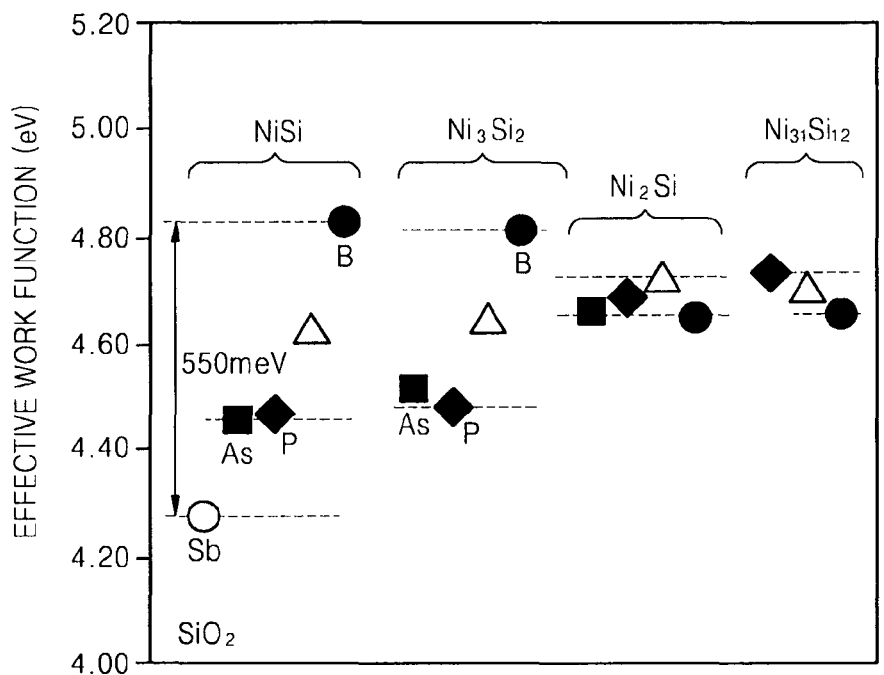
FIG. 11A illustrates the effective work functions of gate electrodes according to the types of dopants used when a first tunnelling insulating layer of FIG. 2 includes $SiO_2$.

FIG. 11A illustrates the effective work functions of gate electrodes according to the types of dopants used when the first tunnelling insulating layer 110 of FIG. 2 includes $SiO_2$.

Referring to FIG. 11A, when the first tunnelling insulating layer 110 is $SiO_2$ and the second silicide layer 195 formed on the first tunnelling insulating layer 110 is NiSi, $Ni_3Si_2$, $Ni_2Si$, and $Ni_{31}Si_{12}$, the effective work functions according to the types of dopants to be doped into the first tunnelling insulating layer 110 is illustrated. Here, ○ indicates when a dopant is Sb, and ■ indicates when a dopant is As, and ◆ indicates when a dopant is P, and ● indicates when a dopant is B, and Δ indicates when no dopant is doped into the first tunnelling insulating layer 110. In this regard, the second silicide layer 195 including Ni is just an example of the inventive concept, and in another embodiment, the second silicide layer 195 may include another metal.

First, when the second silicide layer 195 is a nickel-mono silicide layer (NiSi) formed on the first tunnelling insulating layer 10, there is a large difference between the effective work functions according to the types of dopants used. In particular, there is a difference of about 550 meV between the work function when the dopant is Sb and the work function when the dopant is B. Further, when the second silicide layer 195 formed on the first tunnelling insulating layer 10 is $Ni_3Si_2$, $Ni_2Si$, and $Ni_{31}Si_{12}$, there is no large difference between effective work functions according to the type of dopant doped into the first tunnelling effective layer 110.

Thus, in the current embodiment, the first tunnelling insulating layer 110 may be formed of $SiO_2$, and the second silicide layer 195 formed on the first tunnelling insulating layer 110 may be formed of nickel-monosilicide, i.e., NiSi, having substantially the same contents of metal and silicon. As such, a PMOS transistor or an NMOS transistor may be formed in the peripheral circuit region B by changing the type of dopant doped into the first tunnelling insulating layer 110.

Figure 11B:
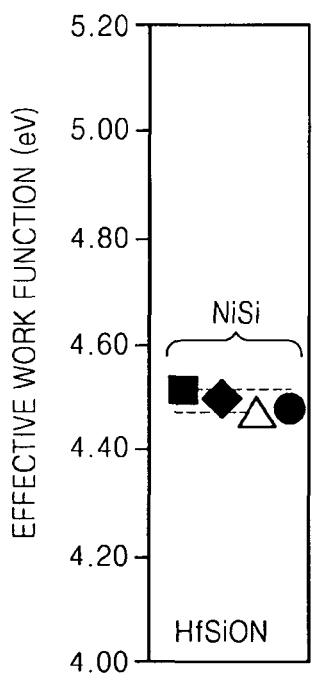
FIG. 11B illustrates the effective work functions of gate electrodes according to the types of dopants used when the first tunnelling insulating layer of FIG. 2 includes HfSiON.

FIG. 11B illustrates an effective work function of gate electrodes according to the types of dopants used when the first tunnelling insulating layer 110 of FIG. 2 includes HfSiON.

Referring to FIG. 11B, when the first tunnelling insulating layer 110 is HfSiON and the second silicide layer 195 formed on the first tunnelling insulating layer 110 is NiSi, the effective work functions according to the type of dopant to be doped into the first tunnelling insulating layer 110 is illustrated. Here, ■ indicates when a dopant is As, and ◆ indicates when a dopant is P, and ● indicates when a dopant is B, and Δ indicates when no dopant is doped into the first tunnelling insulating layer 110. In this regard, the second silicide layer 195 including Ni is just an example of the inventive concept, and in another embodiment, the second silicide layer 195 may include another metal.

Referring to FIG. 11B, although the second silicide layer 195 is a mono silicide layer (NiSi) formed on the first tunnelling insulating layer 110, when the first tunnelling insulating layer 110 is formed of HfSiON, there is no substantial difference between the effective work functions according to the type of dopant doped into the first tunnelling insulating layer 110. Thus, in this case, it is not easy to form a PMOS transistor and an NMOS transistor in the peripheral circuit region B by changing the type of dopant doped into the first tunnelling insulating layer 110.

Figure 12A:
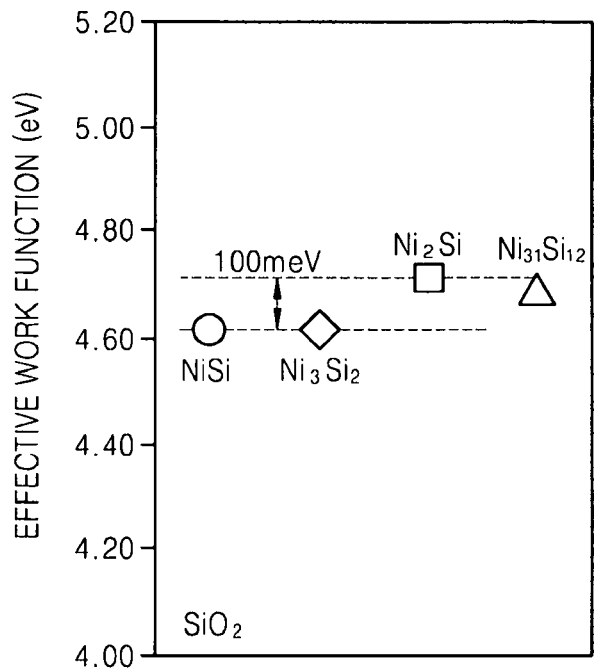
FIG. 12A illustrates the effective work functions of gate electrodes when a blocking insulating layer of FIG. 5 includes $SiO_2$.

FIG. 12A illustrates the effective work functions of gate electrodes when the blocking insulating layer 143 of FIG. 5 includes $SiO_2$.

Referring to FIG. 12A, ○ indicates when the first silicide layer 190 is NiSi, and ◇ indicates when the first silicide layer 190 is $Ni_3Si_2$, and □ indicates when the first silicide layer 190 is $Ni_2Si$, and Δ indicates when the first silicide layer 190 is $Ni_{31}Si_{12}$. In this regard, the first silicide layer 190 including Ni is just an example of the inventive concept, and in another embodiment, the first silicide layer 190 may include another metal.

The effective work function when the blocking insulating layer 143 is $SiO_2$ and the first silicide layer 190 formed on the blocking insulating layer 143 is NiSi or $Ni_3Si_2$ is about 4.60 eV, and the effective work function when the first silicide layer 190 is $Ni_2Si$ or $Ni_{31}Si_{12}$ is about 4.70 eV. In this way, when the blocking insulating layer 143 is $SiO_2$, even though the content of metal in the first silicide layer 190 is more than the content of silicon, the effective work function of the gate electrodes is not greatly increased.

Figure 12B:
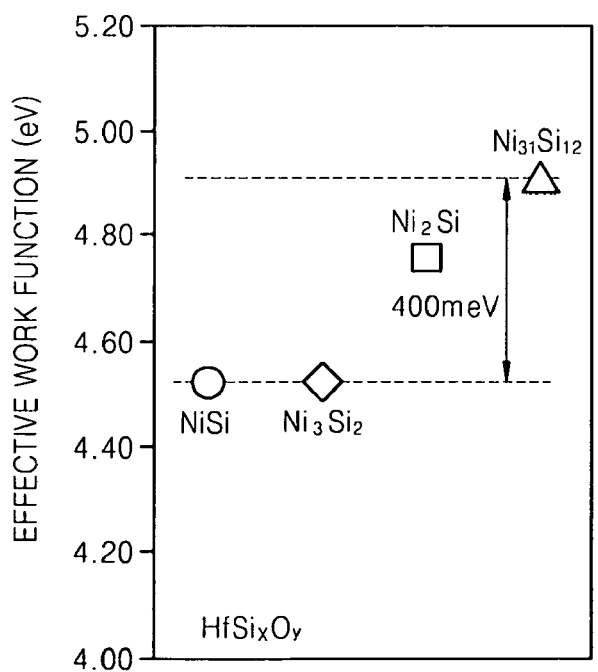
FIG. 12B illustrates the effective work functions of gate electrodes when the blocking insulating layer of FIG. 5 includes HfSixOy.

FIG. 12B illustrates an effective work function of gate electrodes when the blocking insulating layer 143 of FIG. 5 includes HfSixOy.

Referring to FIG. 12B, ○ indicates when the first silicide layer 190 is NiSi, and ◇ indicates when the first silicide layer 190 is $Ni_3Si_2$, and □ indicates when the first silicide layer 190 is $Ni_2Si$, and Δ indicates when the first silicide layer 190 is $Ni_{31}Si_{12}$. In this regard, the first silicide layer 190 including Ni is just an example of the inventive concept, and in another embodiment, the first silicide layer 190 may include another metal.

The effective work function when the blocking insulating layer 143 is HfSixOy and the first silicide layer 190 formed on the blocking insulating layer 143 is NiSi or $Ni_3Si_2$ is about 4.50 eV, and the effective work function when the first silicide layer 190 is $Ni_2Si$ is about 4.80 eV, and the effective work function when the first silicide layer 190 is $Ni_{31}Si_{12}$ is about 4.90 eV. In this way, when the blocking insulating layer 143 is HfSixOy and the content of metal in the first silicide layer 190 is more than the content of silicon, the effective work function of the gate electrodes increases. In particular, the effective work function when the first silicide layer 190 is $Ni_{31}Si_{12}$ is about 400 meV larger than the effective work function when the first silicide layer 190 is NiSi or $Ni_3Si_2$.

Accordingly, when the blocking insulating layer 143 is formed of a high-k dielectric material such as HfSixOy, as the content of metal in the first silicide layer 190 increases, the effective work function of the gate electrodes increases. Thus, the speed of an erase operation of a memory device increases, and the erase operation can be enhanced.

Figure 13:
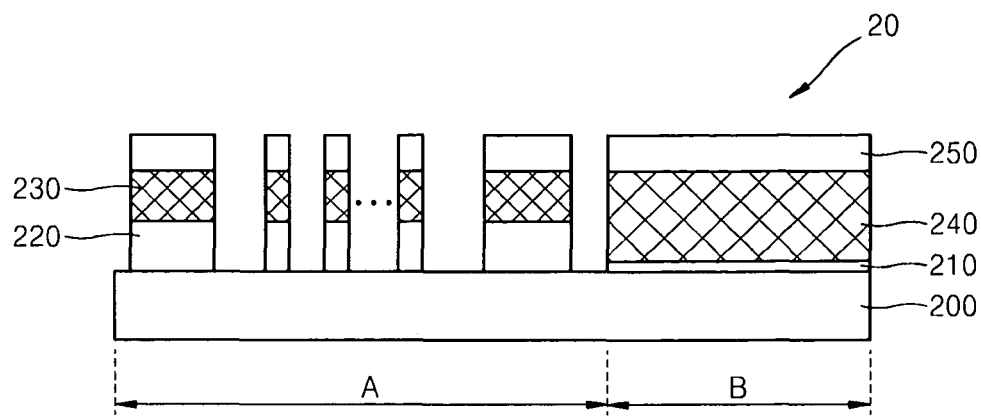
FIG. 13 is a cross-sectional view of a semiconductor device according to an embodiment of the inventive concept.

FIG. 13 is a cross-sectional view of a semiconductor device 20 according to an embodiment of the inventive concept.

Referring to FIG. 13, the semiconductor device 20 according to the current embodiment includes a substrate 200 including a memory cell region A and a peripheral circuit region B, a plurality of memory cells formed in the memory cell region A, and at least one transistor formed in the peripheral circuit region B. Here, the semiconductor device 20 is a NAND flash memory device. However, the inventive concept is not limited thereto and may be applied to other semiconductor device including a floating gate.

Each of the memory cells formed in the memory cell region A includes a stack structure 220, a first silicide layer 230, and a hard disk layer 250.

Here, the stack structure 220 includes a floating gate, and the first silicide layer 230 operates as a control gate. Specifically, the stack structure 220 may include a first tunnelling insulating layer, a charge trap layer, and a blocking insulating layer. Here, a control gate formed in the memory cell region A may include a FUSI layer that does not include an unsilicidated polysilicon layer. In addition, the hard disk layer 250 may be an oxide layer, a nitride layer or a combination thereof.

Here, the blocking insulating layer may be formed of a high-k dielectric material. For example, the blocking insulating layer may be formed of HfSixOy. In addition, the first silicide layer 230 may be a metal-rich silicide layer having a higher content of metal than of silicon. For example, the first silicide layer 230 may be $Ni_{31}Si_{12}$.

At least one transistor formed in the peripheral circuit region B includes a second tunnelling insulating layer 210, a second silicide layer 240, and a hard mark layer 250.

Here, the second tunnelling insulating layer 210 may be formed of $SiO_2$. In addition, the second silicide layer 240 may be formed of a monosilicide layer having substantially the same contents of metal and silicon. For example, the second silicide layer 240 may be NiSi.

Figure 14:
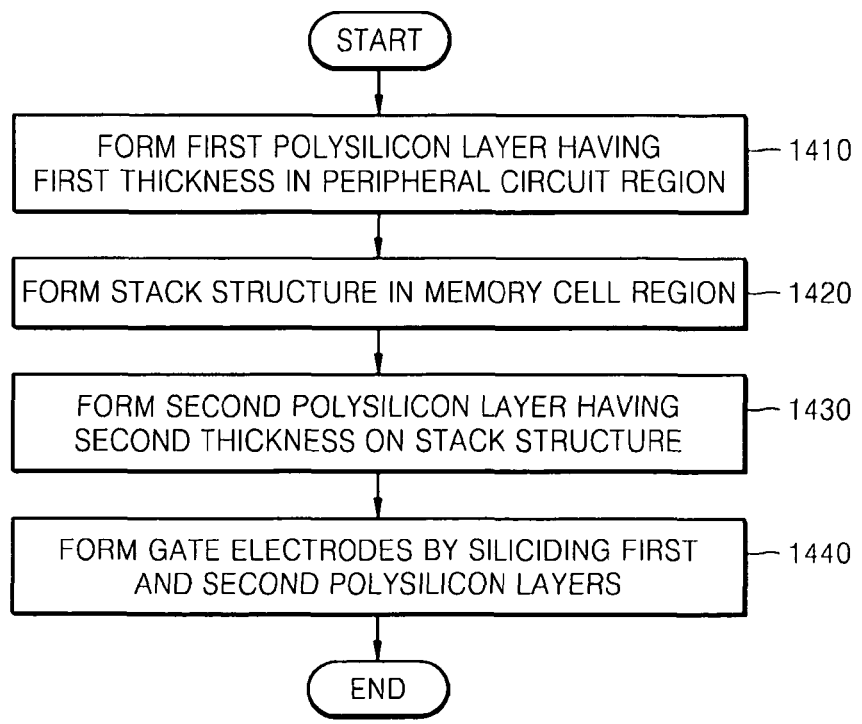
FIG. 14 is a flowchart illustrating a method of fabricating a semiconductor device according to an embodiment of the inventive concept.

FIG. 14 is a flowchart illustrating a method of fabricating a semiconductor device according to an embodiment of the inventive concept.

Referring to FIG. 14, in operation 1410, the first polysilicon layer 120 having a first thickness is formed in the peripheral circuit region B formed on the substrate 100. In another embodiment, the method may further include forming the first tunnelling insulating layer 110 in the peripheral circuit region B on the substrate 100 before disposing the first polysilicon layer 120. In this case, the first polysilicon layer 120 may be formed on the first tunnelling insulating layer 110. Here, the first tunnelling insulating layer 110 may include $SiO_2$. In another embodiment, the method may further include forming a PMOS transistor or an NMOS transistor in the peripheral circuit region B by changing the type of dopant doped into the second tunnelling insulating layer 141.

In operation 1420, the stack structure 220 including the second tunnelling insulating layer 141, the charge trap layer 142, and the blocking insulating layer 143 is formed in a cell region (in the memory cell region A) of the substrate 100. Here, the blocking insulating layer 143 may include a high-k dielectric material such as HfSixOy.

In operation 1430, the second polysilicon layer 150 having a second thickness that is smaller than the first thickness is formed on the blocking insulating layer 143.

In operation 1440, gate electrodes are formed by siliciding the first and second polysilicon layers 120 and 150. More specifically, the metal layer 180 is formed on the first and second polysilicon layers 120 and 150, and the metal layer 180 is treated by heat, and full silicide gate electrodes are formed by a silicide reaction that occurs between the first and second polysilicon layers 120 and 150 and the metal layer 180.

In this case, the full silicide gate electrodes formed by the silicide reaction between the first polysilicon layer 120 and the metal layer 180 may be monosilicide gate electrodes having the same contents of silicon and metal. In addition, the full silicide gate electrodes formed by the silicide reaction between the second polysilicon layer 150 and the metal layer 180 may be metal-rich silicide gate electrodes having a higher content of metal than of silicon.

Figure 15:
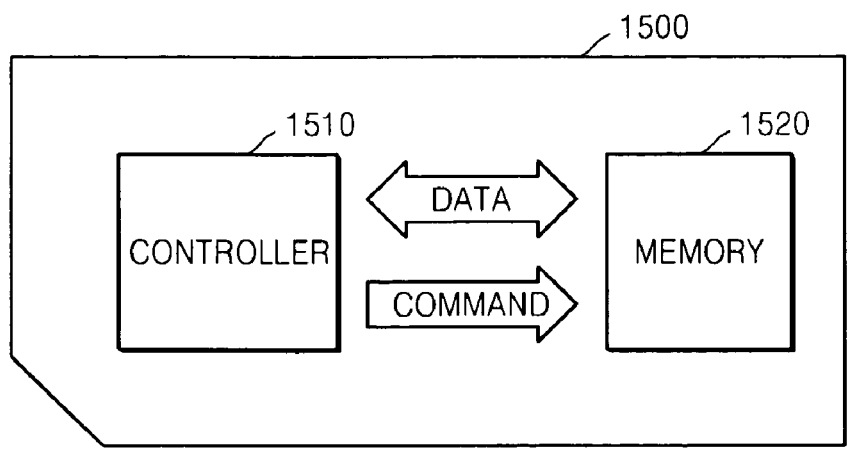
FIG. 15 illustrates a card according to an embodiment of the inventive concept.

FIG. 15 illustrates a card 1500 according to an embodiment of the inventive concept. Referring to FIG. 15, the card 1500 according to the current embodiment may be arranged so that a controller 1510 and a memory 1520 exchange an electrical signal. For example, when a command is given by the controller 1510, the memory 1520 may transmit data. The memory 1520 may include the semiconductor device 20 of FIG. 13. The card 1500 may be used in a memory device including a variety of cards such as memory stick cards, smart media (SM) cards, secure digital (SD) cards, mini secure digital (mini SD) cards or multi media cards (MMC).

Figure 16:
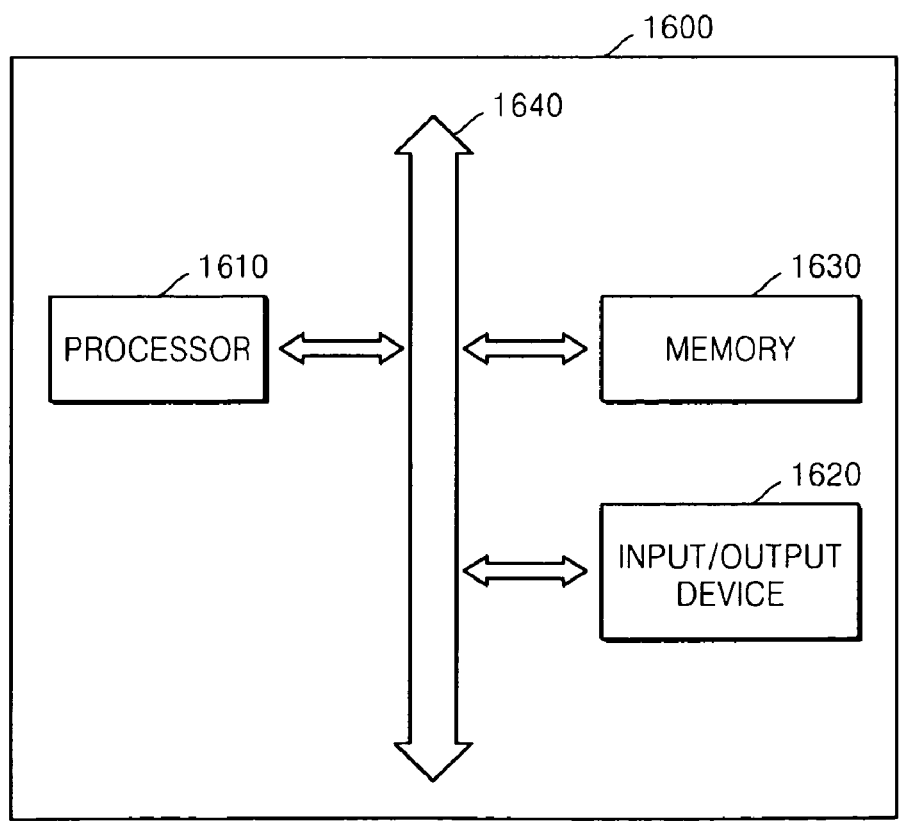
FIG. 16 illustrates a system according to an embodiment of the inventive concept.

FIG. 16 illustrates a system 1600 according to an embodiment of the inventive concept.

Referring to FIG. 16, the system 1600 according to the current embodiment includes a processor 1610, an input/output unit 1620, and a memory 1630. The processor 1610, the input/output unit 1620, and the memory 1630 may perform data communication with one another by using a bus 1640. The processor 1610 may execute a program and control the system 1600. The input/output unit 1620 may be used to input or output data stored in the system 1600. The system 1600 may be connected to an external device, for example, a personal computer (PC) or network by using the input/output unit 1620 and may exchange data with the external device. The memory 1630 may include the semiconductor device 20 of FIG. 13. For example, the memory 1630 may store a code and data for performing an operation of the processor 1610. For example, the system 1600 may be used in a mobile phone, an MP3 player, a navigation device, a portable multimedia player (PMP), a solid state disk (SSD) or a household appliance.

In addition, other embodiments can also be implemented through computer readable code/instructions in/on a medium, e.g., a computer readable medium, to control at least one processing element to implement any of the above described embodiments. The medium can correspond to any medium/media permitting the storage and/or transmission of the computer readable code.

The computer readable code can be recorded/transferred on a medium in a variety of ways, with examples of the medium including recording media, such as magnetic storage media (e.g., ROM, floppy disks, hard disks, etc.) and optical recording media (e.g., CD-ROMs, or DVDs). Thus, the medium may be such a defined and measurable structure including or carrying a signal or information, such as a device carrying a bitstream according to one or more embodiments. The medium may also be a distributed network, so that the computer readable code is stored/transferred and executed in a distributed fashion. Furthermore, the processing element could include a processor or a computer processor, and processing elements may be distributed and/or included in a single device. Here, a program or code stored in a storage medium indicates a series of instructions that are directly or indirectly used by a computer in a device having a data processing ability so as to obtain a predetermined result. Thus, although being actually used, the term computer is referring to all devices including a memory, an input/output unit, and an operational unit and having data processing ability for performing a specific function by using a program.

While the inventive concept has been particularly shown and described with reference to exemplary embodiments thereof, it will be understood that various changes in form and details may be made therein without departing from the spirit and scope of the following claims.

What is claimed is:

1. A method of fabricating a semiconductor device, the method comprising:
    forming a first polysilicon layer having a first thickness in a peripheral circuit region disposed on a substrate;
    forming a stack structure comprising a first tunneling insulating layer, a charge trap layer, and a blocking insulating layer in a memory cell region disposed on the substrate;
    forming a second polysilicon layer having a second thickness that is less than the first thickness on the blocking insulating layer;
    forming gate electrodes by siliciding the first and second polysilicon layers;
    forming a plurality of gate stack structures by patterning the second polysilicon layer, the blocking insulating layer, the charge trap layer, and the first tunneling insulating layer, which are formed in the memory cell region;
    forming a source/drain region by implanting an impurity into a surface of the substrate exposed to both sides of the plurality of gate stack structures;
    forming an oxide layer between each of the plurality of gate stack structures by performing an oxidation reaction over the substrate in which the plurality of gate stack structures are formed; and
    removing a portion of the oxide layer between each of the plurality of gate stack structures to a height at which the blocking insulating layer is formed.

2. The method of claim 1, further comprising forming a second tunneling insulating layer in the peripheral circuit region of the substrate, wherein the forming of the first polysilicon layer comprises forming the first polysilicon layer on the second tunneling insulating layer.

3. The method of claim 2, wherein the second tunneling insulating layer comprises $SiO_2$.

4. The method of claim 2, further comprising forming a p-channel metal oxide semiconductor (PMOS) transistor or a n-channel metal oxide semiconductor (NMOS) transistor in the peripheral circuit region according to the type of dopant doped into the second tunneling insulating layer.

5. The method of claim 1, wherein the blocking insulating layer comprises a high-k dielectric material.

6. The method of claim 5, wherein the blocking insulating layer comprises $HfSi_xO_y$.

7. The method of claim 1, wherein the forming of the gate electrodes comprises:
    forming a metal layer on the first and second polysilicon layers; and
    forming full silicide gate electrodes by a silicide reaction between the first and second polysilicon layers and the metal layer by heat-treating the metal layer.

8. The method of claim 7, wherein the full silicide gate electrodes formed by the silicide reaction between the first polysilicon layer and the metal layer comprise monosilicide gate electrodes having the same contents of silicon and metal.

9. The method of claim 7, wherein the full silicide gate electrodes formed by the silicide reaction between the second polysilicon layer and the metal layer comprise metal-rich silicide gate electrodes having a higher content of metal than of silicon.

10. The method of claim 7, wherein the forming of the metal layer comprises forming the metal layer by simultaneously applying a metal material on the first and second polysilicon layers and the oxide layer.

11. The method of claim 10, wherein the forming of the full silicide gate electrodes comprises:
    performing a first heat treatment on the substrate in which the metal layer is formed, at a first temperature so as to cause the silicide reaction between the metal layer and the first polysilicon layer and between the metal layer and the second polysilicon layer;
    removing a portion of the metal layer formed on the oxide layer, since the silicide reaction does not occur between the oxide layer and the portion of the metal layer formed on the oxide layer during the first heat treatment; and
    performing a second heat treatment on the substrate in which the portion of the metal formed on the oxide layer is removed, at a second temperature higher than the first temperature so that a first full silicide gate electrode is formed by the silicide reaction between the first polysilicon layer and the metal layer and a second full silicide gate electrode is formed by the silicide reaction between the second polysilicon layer and the metal layer, the first polysilicon layer being a monosilicide gate electrode and the second polysilicon layer being a metal-rich silicide gate electrode.

* * * * *